United States Patent
Tian et al.

(10) Patent No.: US 7,895,971 B2
(45) Date of Patent: Mar. 1, 2011

(54) MICROWAVE PLASMA PROCESSING APPARATUS

(75) Inventors: Caizhong Tian, Amagasaki (JP); Toshihisa Nozawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 709 days.

(21) Appl. No.: 11/576,852

(22) PCT Filed: Oct. 6, 2005

(86) PCT No.: PCT/JP2005/018545

§ 371 (c)(1),
(2), (4) Date: Apr. 6, 2007

(87) PCT Pub. No.: WO2006/038672

PCT Pub. Date: Apr. 13, 2006

(65) Prior Publication Data

US 2007/0283887 A1    Dec. 13, 2007

(30) Foreign Application Priority Data

Oct. 7, 2004    (JP)    ............................. 2004-294997

(51) Int. Cl.
*C23C 16/00*    (2006.01)
*C23C 14/00*    (2006.01)
*C23F 1/00*    (2006.01)
*H01L 21/306*    (2006.01)

(52) U.S. Cl. .................. 118/723 MW; 156/345.41; 204/157.43; 204/298.38

(58) Field of Classification Search ......... 118/723 MW; 156/345.41; 219/690–697; 204/157.43, 204/298.38; 216/69; 427/508, 553, 575, 427/595, 904; 438/726, 772, 777

See application file for complete search history.

(56) References Cited

U.S. PATENT DOCUMENTS

| | | | | |
|---|---|---|---|---|
| 6,675,737 B2 * | 1/2004 | Hongoh et al. | ...... | 118/723 MW |
| 6,736,930 B1 * | 5/2004 | Hongoh | .................. | 156/345.41 |
| 7,311,796 B2 * | 12/2007 | Goto et al. | ............. | 156/345.36 |
| 2005/0082003 A1 * | 4/2005 | Ishii | ...................... | 156/345.41 |

FOREIGN PATENT DOCUMENTS

| | | | |
|---|---|---|---|
| JP | 2000-277508 | * | 10/2000 |
| JP | 2000 294550 | | 10/2000 |
| JP | 2001 320227 | | 11/2001 |
| JP | 2003-188152 | * | 7/2003 |
| JP | 2003 264181 | | 9/2003 |
| JP | 2004 265916 | | 9/2004 |
| JP | 2004 266268 | | 9/2004 |

* cited by examiner

*Primary Examiner*—Parviz Hassanzadeh
*Assistant Examiner*—Rakesh Dhingra
(74) *Attorney, Agent, or Firm*—Oblon, Spivak, McClelland, Maier & Neustadt, L.L.P.

(57) ABSTRACT

A microwave plasma processing apparatus which easily ensures uniformity and stability of plasma in response to changes of process conditions and the like. The microwave plasma processing apparatus generates plasma of a process gas in a chamber by microwave and performs plasma processing to a work to be processed by using the plasma. On a plate composed of a conductor covering the outer circumference of a microwave transmitting board, two or more holes for propagating microwave from an edge part of the microwave transmitting board to an inner part of the plate are formed. Volume adjusting mechanisms and adjust the volume of the holes to adjust impedance of each unit when the microwave transmitting board is divided into individual units to which each of the holes belongs, and electric field distribution of the microwave transmitting board is controlled.

18 Claims, 9 Drawing Sheets

MICROWAVE PLASMA PROCESSING APPARATUS

FIELD OF THE INVENTION

The present invention relates to a microwave plasma processing apparatus by which an object is processed by microwave plasma.

BACKGROUND OF THE INVENTION

A plasma processing is a technique indispensable to the manufacture of semiconductor devices. In recent years, a design rule for semiconductor elements constituting an LSI becomes gradually miniaturized with a view to comply with a demand for high-integration and high-speed LSI, and a semiconductor wafer grows in size. In keeping with this trend, a plasma processing apparatus is required to cope with the miniaturization and the size growth.

In cases of a parallel plate plasma processing apparatus and an inductively-coupled plasma processing apparatus, both of which have been extensively used in the art, plasma damage may occur in a fine-size element due to an increased temperature of electrons. Further, since a plasma density is kept high only in a limited region, it is difficult to uniformly plasma-process a large-size semiconductor wafer at an increased speed.

In view of this, attention has been paid to a RLSA (Radial Line Slot Antenna) type microwave plasma processing apparatus capable of uniformly generating plasma with a high density and at a low electron temperature (see, e.g., Patent Reference 1).

The RLSA type microwave plasma processing apparatus is provided with a planar antenna in an upper portion of a chamber, the planar antenna having a multiple number of slots formed in a specified pattern (a radial line slot antenna). With this type of plasma processing apparatus, microwaves generated in a microwave generator are allowed to pass the slots of the planar antenna and are irradiated into a vacuum chamber through a dielectric microwave transmitting board provided below the planar antenna. A gas introduced into the chamber is converted to plasma by means of a microwave electric field. Processing targets such as a semiconductor wafer and the like are processed by the plasma thus generated.

The RLSA type microwave plasma processing apparatus has an ability to realize a high plasma density over a broad region just below the antenna and therefore is capable of performing a uniform plasma processing within a short period of time. Moreover, this apparatus generates plasma having a low electron temperature, which helps to reduce damage to an element.

In the RTSA type microwave plasma processing apparatus, the distribution and stability of plasma varies with process conditions even when the planar antenna used is one and the same. For the very reason, in order to assure uniformity and stability of the plasma, there is a need to optimize pattern of the slots of the planar antenna and a microwave transmitting board each time the process conditions are changed. This task is extremely onerous.

Patent Reference 1 Japanese Patent Laid-open Application No 2000-294550

DISCLOSURE OF THE INVENTION

It is, therefore, an object of the present invention to provide a microwave plasma processing apparatus capable of easily assuring uniformity and stability of plasma in response to a change in process condition or the like.

In accordance with a first aspect of the present invention, there is provided a microwave plasma processing apparatus, including:
a chamber for receiving a processing target;
a microwave generator for generating microwaves;
a waveguide unit for guiding the microwaves generated in the microwave generator toward the chamber;
a planar antenna made of a conductive material and having a plurality of microwave radiation holes through which the microwaves guided by the waveguide unit are irradiated toward the chamber;
a microwave transmitting board made of a dielectric material and forming a top wall of the chamber, the microwave transmitting board adapted to transmit the microwaves passed through the microwave radiation holes of the planar antenna;
a plate made of a conductive material and covering an outer periphery of the microwave transmitting board;
two or more holes into which the microwaves are propagated from the microwave transmitting board, the holes being provided to extend from an end portion of the microwave transmitting board into the plate;
a volume adjustment mechanism for adjusting volumes of the holes; and
a processing gas supply unit for supplying a processing gas into the chamber,
wherein plasma of the processing gas is formed within the chamber by the microwaves to perform a plasma processing of the processing target, and wherein, when the microwave transmitting board is divided into individual units to which each of the two or more holes belongs, impedance of the individual units is adjusted to thereby control an electric field distribution of the microwave transmitting board by adjusting the volumes of the holes with the volume adjustment mechanism.

In accordance with a second aspect of the present invention, there is provided a microwave plasma processing apparatus, including:
a chamber or receiving a processing target;
a microwave generator for generating microwaves;
a waveguide unit for guiding the microwaves generated in the microwave generator toward the chamber;
a planar antenna made of a conductive material and having a plurality of microwave radiation holes through which the microwaves guided by the waveguide unit are irradiated toward the chamber;
a microwave transmitting board made of a dielectric material and forming a top wall of the chamber, the microwave transmitting board adapted to transmit the microwaves passed through the microwave radiation holes of the planar antenna;
a plate made of a conductive material and covering an outer periphery of the microwave transmitting board;
two or more holes into which the microwaves are propagated from the microwave transmitting board, the holes being provided to extend from an end portion of the microwave transmitting board into the plate;
a volume adjustment mechanism for adjusting volumes of the holes; and
a processing gas supply unit for supplying a processing gas into the chamber,
wherein plasma of the processing gas is formed within the chamber by the microwaves to perform a plasma processing of the processing target, and wherein when the microwave transmitting board is divided into individual units to which each of the two or more holes belongs, impedance of the individual units is adjusted to have the individual units satisfy resonance conditions by adjusting the volumes of the holes with the volume adjustment mechanism.

In the second aspect, it is preferable that the microwave transmitting board as a whole is adapted to satisfy the resonance conditions.

In the first and the second aspect, it is preferable that the volume adjustment mechanism includes a volume adjustment plugs provided in close contact with the holes for movement within the holes and an actuator for moving the volume adjustment plugs. Further, it is preferable that the microwave plasma processing apparatus further includes a controller for controlling the impedance of the individual units by controlling the volume adjustment mechanism.

It is preferable that the waveguide unit includes a rectangular waveguide for propagating the microwaves generated by the microwave generator in a TE mode, a mode converter for converting the TE mode to a TEM mode, and a coaxial waveguide for propagating the microwaves converted to the TEM mode toward the planar antenna.

It is preferable that the plurality of microwave radiation holes are of an elongated slot shape and are arranged to have adjoining holes intersect with each other, the microwave radiation holes being arranged along concentric circles.

Further, it is preferable that the microwave plasma processing apparatus further includes a cover member for covering the planar antenna. In this case, it is preferable that the cover member has a coolant path through which coolant is circulated to cool the planar antenna and the microwave transmitting board.

In accordance with the present invention, two or more holes extend from an end portion of a microwave transmitting board into the plate so that microwaves arriving at the microwave transmitting board via a planar antenna can be propagated into the holes. Furthermore, a volume adjustment mechanism is provided to adjust volumes of the holes. When the microwave transmitting board is divided into individual units to which each of the two or more holes belongs, impedance of the individual units is controlled to thereby control an electric field distribution of the microwave transmitting board by adjusting the volumes of the holes with the volume adjustment mechanism. Thus, in the event that process conditions or the like are changed it is possible to assure increased uniformity and stability of plasma by controlling the electric field distribution of the microwave transmitting board through a simple operation but without having to optimize a pattern of microwave radiation holes of a planar antenna and a microwave transmitting board.

More specifically, when the microwave transmitting board is divided into individual units to which each of the two or more holes belongs, the electric field distribution of the microwave transmitting board can be made uniform by controlling the impedance of the individual units and allowing each of the units to satisfy resonance conditions. This helps to realize a plasma processing with increased uniformity and stability.

DETAILED DESCRIPTION OF THE EMBODIMENTS

Hereinafter, embodiments of the present invention will be described in detail with reference to the accompanying drawings.

Figure 1:
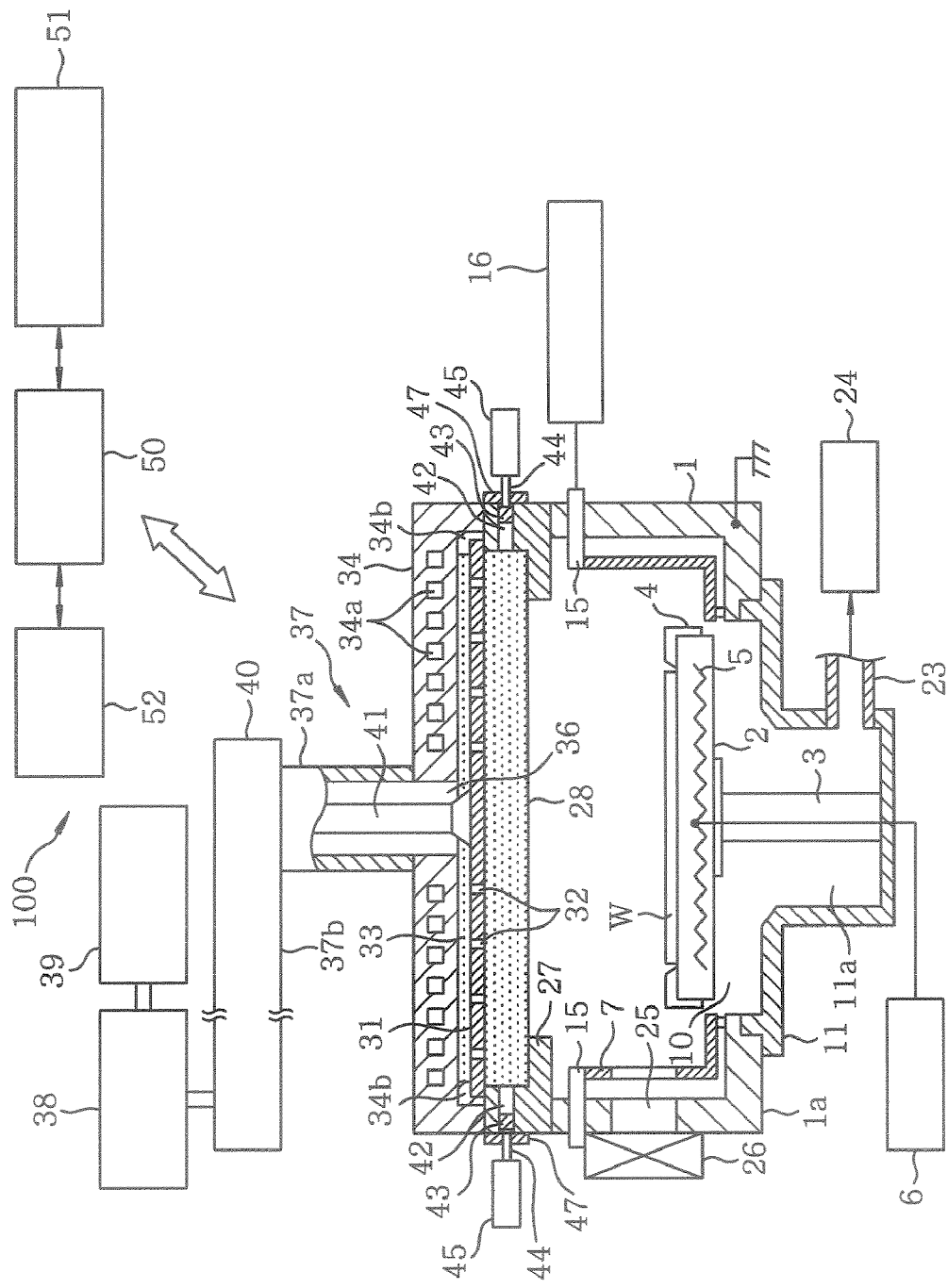
FIG. 1 is a section view showing a frame format of a microwave plasma processing apparatus in accordance with one embodiment of the present invention.

FIG. 1 is a section view showing a frame format of a microwave plasma processing apparatus in accordance with one embodiment of the present invention.

The microwave plasma processing apparatus 100 is configured with a RLSA type microwave plasma processing apparatus that produces plasma by irradiating microwaves generated from a microwave generator into a chamber by use of a planar antenna (a radial line slot antenna) having a multiple number of slots formed in a specified pattern.

The microwave plasma processing apparatus 100 includes a substantially cylindrical chamber 1 airtiqhtly sealed and grounded. A circular opening 10 is provided at an approximately central portion of a bottom wall 1a of the chamber 1. An exhaust chamber 11 communicates with the opening 10 and protrudes downwardly from the bottom wall 1a. Within the chamber 1, there is provided a susceptor 2 for horizontally supporting a wafer W as a processing target, the susceptor 2 being made of ceramics such as AlN or the like. The susceptor 2 is supported by a cylindrical support member 3 extending upwardly from a bottom center of the exhaust chamber 11 the support member 3 being made of ceramics such as AlN or the like. A guide ring 4 for guiding the wafer W is provided along a peripheral edge portion of the susceptor 2. Embedded in the susceptor 2 is a resistance heater 5 that serves to heat the susceptor 2 using electric power supplied from a heater power source 6. The heat thus generated is used in heating the wafer W as an object body. A cylindrical liner 7 made of a quartz is provided along an inner circumference of the chamber 1.

Wafer support pins (not shown) for supporting and moving up and down the wafer W are provided in the susceptor 2 in such a way that they can protrude and retract with respect to a surface of the susceptor 2.

A ring-shaped gas introducing member 15 is provided in a side wall of the chamber 1 and a processing gas supply system 16 is connected to the gas introducing member 15. The gas introducing member may be arranged in a showerhead-like pattern. A specific processing gas is introduced into the chamber 1 from the processing gas supply system 16 via the gas introducing member 15. The processing gas used varies with the kinds of plasma processes. Examples of the plasma processes include an etching process and an oxidation process.

A gas exhaust line 23 is connected to a side surface of the exhaust chamber 11 and a gas exhaust unit 24 including a high-speed vacuum pump is coupled to the gas exhaust line 23. By operating the gas exhaust unit 24 the gas in the chamber 1 is uniformly discharged into a space 1ea of the exhaust chamber 11 and then exhausted via the gas exhaust line 23. This makes it possible to depressurize the chamber 1 to a specific vacuum level, e.g., 0.133 Pa, at an increased speed.

In the side wall of the chamber 1, there is provided a gate 25 through which the wafer W is transferred between the chamber 1 and a transfer chamber (not shown) adjoining the plasma processing apparatus 100. A gate valve 26 for opening and closing the gate 25 is also provided in the side wall of the chamber 1.

The chamber 1 has a top opening, along the peripheral edge portion of which a ring-shaped top plate 27 is airtightly installed via a not shown seal member. Inside the top plate 27, there is provided a microwave transmitting board 28 made of a dielectric material, e.g. quartz or ceramics such as $Al_2O_3$, so as to permit transmission of the microwaves. The top plate 27 is made of a conductive material, e.g., metal such as aluminum, and remains grounded. Furthermore, the top plate 27 has an "L"-like cross section and is adapted to support the microwave transmitting board 28 while covering an outer circumference thereof. The microwave transmitting board 28 is airtightly attached to the top plate 27 via a not shown seal member, thereby keeping the chamber 1 airtight.

Figure 2:
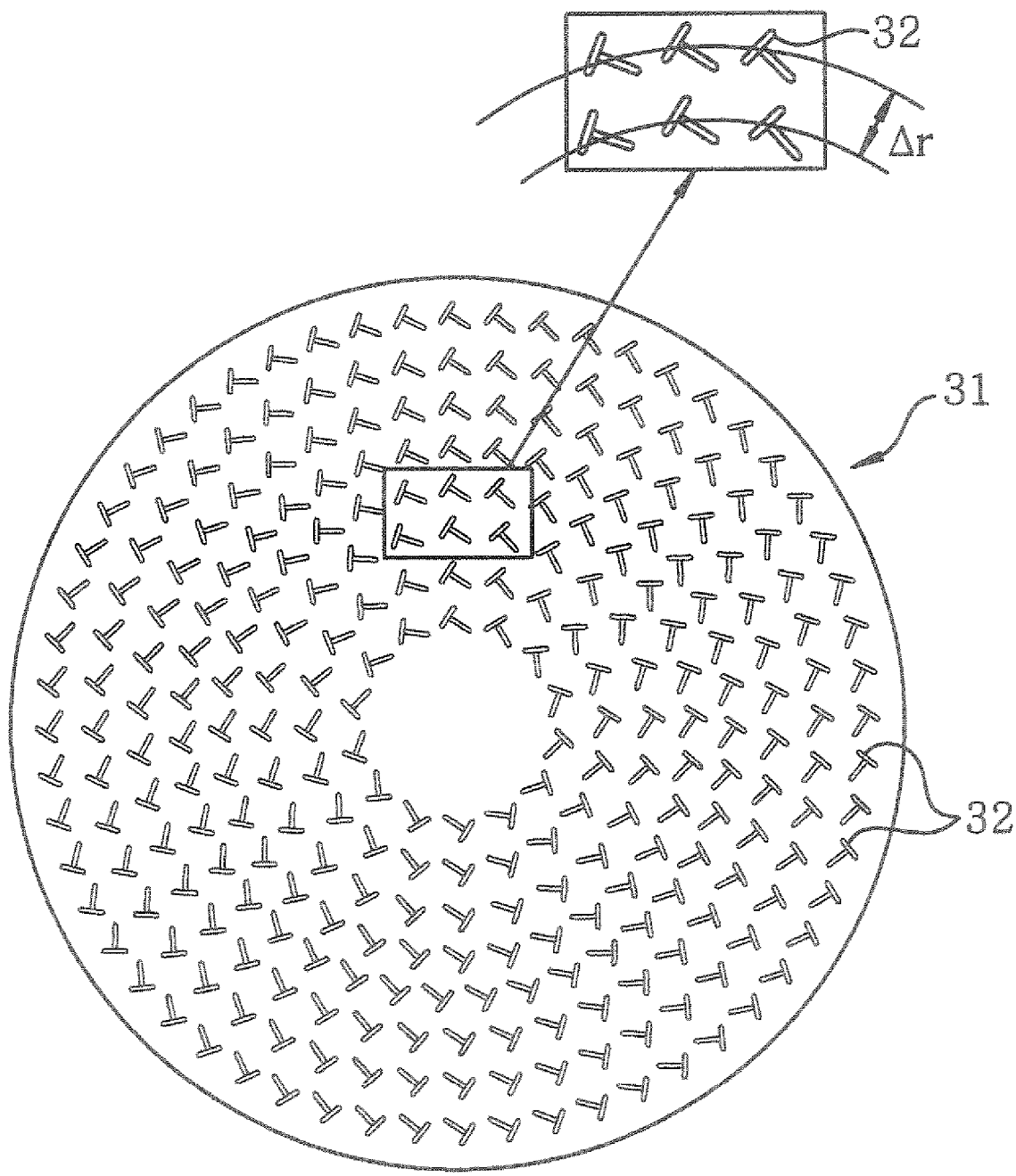
FIG. 2 is a view illustrating a structure of a planar antenna employed in the microwave plasma processing apparatus in accordance with one embodiment of the present invention.

A disc-shaped planar antenna 31 is provided above the microwave transmitting board 28 in such a way as to face the susceptor 2. The planar antenna 31 is put on a top end of the top plate 27. The planar antenna 31 is made of a conductive material, e.g., a copper plate or an aluminum plate whose surface is plated with gold, and has a multiple number of microwave radiation holes (slots) 32 passing through the thickness thereof in a specific pattern. That is to say, the planar antenna 31 is a RLSA type antenna. The microwave radiation holes 32 are of, e.g., an elongated slot shape, and are arranged so that two adjoining holes 32 can intersect with each other, typically at a right angle (in a "T"-like shape) as shown in FIG. 2. The microwave radiation holes 32 are arranged along concentric circles. The length and interval of the microwave radiation holes 32 depends on the wavelength of microwaves or the like. Referring to FIG. 2, the interval between the microwave radiation holes 32 formed along neighboring concentric circles is represented by "Δr". Alternatively, the microwave radiation holes 32 may have other shapes such as a circular shape and an arcuate shape. Moreover, the arrangement pattern of the microwave radiation holes 32 is not particularly limited to the concentric one but may be, e.g., a spiral pattern or a radial pattern.

On a top surface of the planar antenna 31, there is provided a slow-wave member 33 made of a dielectric material having a dielectric constant greater than that of a vacuum. The slow-wave member 33 functions to control plasma by making the wavelength of microwaves shorter than that in a vacuum condition.

The planar antenna 31 makes close contact with the microwave transmitting board 28 and, similarly, the slow-wave member 33 is kept in close contact with the planar antenna 31. The thickness of the microwave transmitting board 28 and the slow-wave member 33 as well as the microwave reflectance of the planar antenna 31 is adjusted to ensure that resonance conditions are satisfied by an equivalent circuit including the slow-wave member 33, the planar antenna 31, the microwave transmitting board 28 and the plasma. This minimizes reflection of the microwaves. Furthermore, the slow-wave member 33 and the microwave transmitting board 28 are made of the same material to prevent interface reflection of the microwaves. By minimizing reflection of the microwaves and preventing interface reflection thereof, it becomes possible to keep microwave power efficiency high while increasing the stability of plasma.

A shield cover member 34 made of a metal e.g. aluminum or stainless steel, is provided on a top surface of the chamber 1 so that it can cover the planar antenna 31 and the slow-wave member 33. The top plate 27 and the shield cover member 34 placed on the top surface of the chamber 1 are sealed by not shown seal members.

The shield cover member 34 has a cooling water path 34a through which cooling water is circulated to cool the planar antenna 31, the microwave transmitting board 28, the slow-wave member 33 and the shield cover member 34. Furthermore, the shield cover member 34 is grounded.

Peripheral portions of the planar antenna 31 and the slow-wave member 33 are pressed down by a pressing member 34b provided inside the shield cover member 34.

At the center of a top wall of the shield cover member 34, there is formed an opening 36 to which a waveguide 37 is connected. A microwave generator 39 is connected to an end portion of the waveguide 37 via a matching circuit 38. This ensures that microwaves having a frequency of, e.g., 2.45 GHz, generated by the microwave generator 39 are propagated to the planar antenna 31 via the waveguide 37. The microwaves may have a frequency of 8.35 GHz or 1.98 GHz or other frequencies.

The waveguide 37 includes a coaxial waveguide 37a of circular cross section extending upwardly from the opening 36 of the shield cover member 34 and a rectangular waveguide 37b of rectangular cross section connected to a top end portion of the coaxial waveguide 37a, the rectangular waveguide 37b extending in a horizontal direction A mode converter 40 is provided at the end portion of the connection part of the rectangular waveguide 37b to the coaxial waveguide 37a. An internal conductor 41 extends through the center of the coaxial waveguide 37a and is fixedly connected at its bottom end portion to the center of the planar antenna 31.

Figure 3:
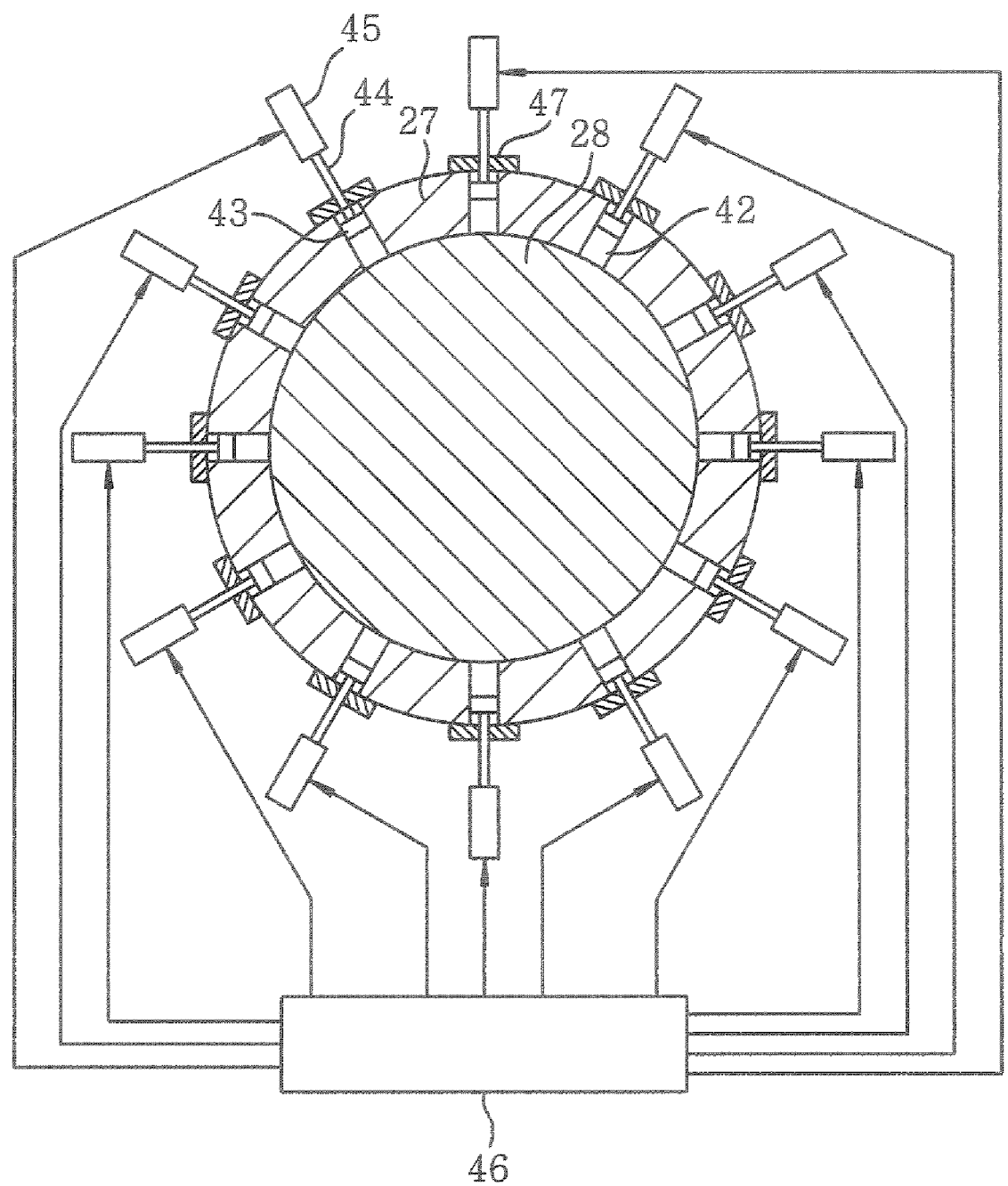
FIG. 3 is a view for explaining major parts of the microwave plasma processing apparatus in accordance with one embodiment of the present invention.

The top plate 27 has a plurality of holes 42 extending horizontally from the end portion of the microwave transmitting board 28 into the top plate 27. In the example shown in FIG. 3, twelve holes 42 are formed at an equal interval to radially extend from the inner periphery to the outer periphery of the top plate 27. The holes 42 are opened in a peripheral end portion of the top plate 27. The holes 42 are designed to propagate therethrough the microwaves arriving at the microwave transmitting board 28 via the planar antenna 31.

Volume adjustment plugs 43 for adjusting volumes of the holes 42 are provided within the holes 42 for movement in a longitudinal direction thereof. The volume adjustment plugs 43 are closely fitted into the holes 42. At least the surface of each of the volume adjustment plugs 43 that contacts the holes 42 is made of a conductive material, e.g. metal such as aluminum or the like. Furthermore, metal covers 47 are provided to close off the holes 42 at the outer circumference of the top plate 27. Thus, the holes 42 are enclosed by conductive materials in their entirety, thereby ensuring that all the microwaves propagated through the holes 42 are reflected with no leakage. Each of the volume adjustment plugs 43 is independently moved by an actuator 45 such as a cylinder mechanism via a rod 44 so that the volume of each of the holes 42 can be adjusted. When the microwave transmitting board 28 is divided into individual units to which each of the holes 42 belongs, impedance of the individual units can be controlled by adjusting the volumes of the holes 42 in this way. In the event that process conditions are changed, a command for controlling the impedance of the individual units is issued from a controller 46 to the respective actuators 45 according to the process conditions, whereby the positions of the volume adjustment plugs 43, i.e., the volumes of the holes 42, are controlled to assure uniformity of an electric field distribution of the microwave transmitting board 28.

Furthermore, other portions of the volume adjustment plugs 43 than the surfaces contacting the holes 42 may be a dielectric material as far as the surfaces contacting the holes 42 are made of a conductive material. Moreover, the number of the holes 42 is not limited to twelve but may be two or more. Preferably the number of the holes 42 is sixteen or less because use of an exceedingly large number of the holes 42 would deteriorate controllability. It is desirable that the holes 42 have a depth equal to or greater than a single wavelength of the microwaves measured in the microwave transmitting board 28 which is a dielectric material. The actuator 45 is not limited to the cylinder mechanism but may be a ball screw mechanism that adjusts the position of each of the volume adjustment plugs 43 by rotating a ball screw with a motor.

Figure 4A:
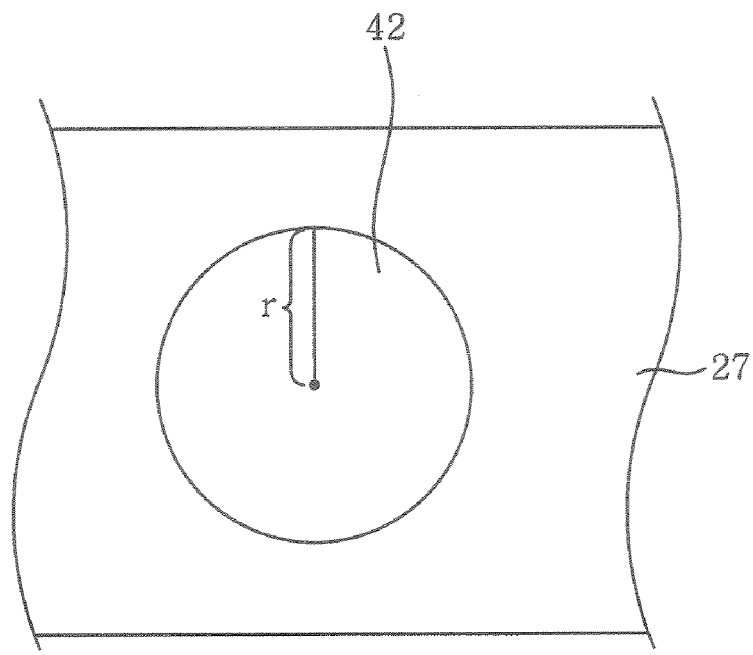
FIGS. 4A and 4B are pattern diagrams depicting the shapes of holes formed in a top plate.
Figure 4B:
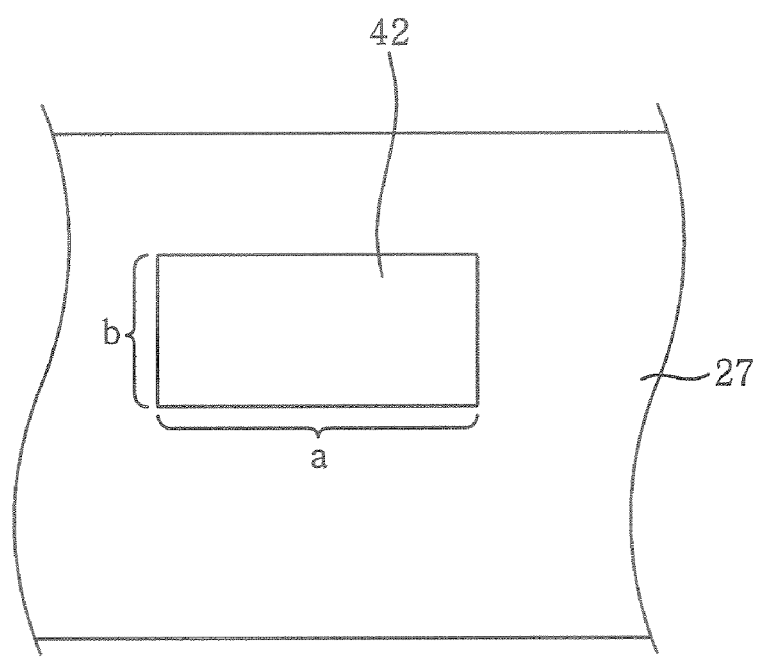

The holes 42 may have either a circular cross section as shown in FIG. 4A or a rectangular cross section as shown in FIG. 4B. In order for the microwaves to be propagated into the holes 42, however it is necessary to satisfy equation (1) or (2)

$$r > \lambda_c/3.41 \quad (1)$$

$$a > \lambda_c/2, \, b > \lambda_c/8 \quad (2)$$

where the "$\lambda_c$" is a wavelength of the microwaves in the microwave transmitting board 28, the "r" is a radius of the holes 42 having a circular cross section, the "a" is a width of the holes 42 having a rectangular cross section, and the "b" is a height of the latter.

Individual components of the plasma processing apparatus 100 are connected to and controlled by a process controller 50. Connected to the process controller 50 is a user interface 51 that includes a keyboard for enabling a process manager to execute a command input operation to thereby manage the plasma processing apparatus 100 and a display for visualizing and displaying an operating status of the plasma processing apparatus 100.

Also connected to the process controller 50$s$ a storage 52 that stores therein a program for realizing various processes of the plasma processing apparatus 100 under a control of the process controller 50 and recipes in which process condition data and the like are recorded.

If needed, an arbitrary recipe is retrieved from the storage 52 by, e.g., inputting a command through the user interface 51, and is executed by the process controller 50, whereby a desired process can be performed in the plasma processing apparatus 100 under a control of the process controller 50.

In the plasma processing apparatus 100 configured as above, the gate valve 26 is first opened and the wafer W as a processing target is transferred into the chamber 1 via the gate 25, after which the wafer W is placed on the susceptor 2.

Then, a specific processing gas required in performing a plasma processing is introduced from the processing gas supply system 16 into the chamber 1 via the gas introducing member 15, thereby maintaining the chamber 1 at a specific pressure.

Subsequently, microwaves generated by the microwave generator 39 are guided into the waveguide 37 via the matching circuit 38. The microwaves are supplied to the planar antenna 31 via the rectangular waveguide 37b, the mode converter 40, the coaxial waveguide 37a and the slow-wave member 33 in sequence. Thereafter, the microwaves arriving at the planar antenna 31 are irradiated into the chamber 1 toward a space above the wafer W via the microwave transmitting board 28. The microwaves are propagated through the rectangular waveguide 37b in a TE mode and then converted to a TEM mode by the mode converter 40, after which the microwaves are propagated through the coaxial waveguide 37a toward the planar antenna 31.

By the microwaves irradiated from the planar antenna 31 into the chamber 1 via the microwave transmitting board 28, the processing gas introduced into the chamber 11$s$ converted to plasma, and a specific process such as an oxidation process or the like is performed by the plasma.

The microwave plasma processing apparatus 100 of the present embodiment is capable of generating plasma having a high plasma density of about $10^{12}$ or more number of electrons/cm$^3$ and a low electron temperature of about 1.5 eV or less. This provides a merit in that it is possible to perform a plasma processing at a low temperature and within a short period of time. Another merit is that it is possible to reduce plasma damage to a base film caused by ions or the like.

Furthermore, in the present embodiment, the plurality of holes 42 extend from the end portion of the microwave transmitting board 27 into the top plate 28 so that the is microwaves arriving at the microwave transmitting board 28 via the planar antenna 31 can be propagated through the holes 42. Furthermore, the volume adjustment plugs 43 and the actuators 45 are provided to adjust volumes of the holes 42. When the microwave transmitting board 28 is divided into individual units to which each of the plurality of holes 42 belongs, impedance of the individual units can be controlled by adjusting the volumes of the holes 42 with the volume adjustment plugs 43 and the actuators 45. This makes it possible to control the electric field distribution of the microwave transmitting board 28. Thus, in the event that process conditions or the like are changed, it is possible to assure uniformity and stability of the plasma by controlling the electric field distribution of the microwave transmitting board 28 through a simple operation but without having to optimize a pattern of the microwave radiation holes 32 of the planar antenna 31 and the microwave transmitting board 28.

A method of controlling the electric field distribution of the microwave transmitting board 28 will be specifically described with reference to a model shown in FIG. 5. First, the microwave transmitting board 28 is divided into individual units 28a to which each of the plurality of holes 42 belongs. In this case, the microwaves are rectilinearly propagated from the center of the microwave transmitting board 28 toward the holes 42 belonging to the respective units 28a and then reflected back by the volume adjustment plugs 43. Now, a coupling coefficient $k_{i,j}$ between two arbitrary neighboring units 28a (an i-th unit and a j-th unit) is defined by equation (3)

$$k_{i,j} = \frac{X_{m(i,j)}}{\sqrt{X_i X_j}} \quad (3)$$

where the $X_{m(i,j)}$ is the reactance of a part common to the two neighboring units 28a and the $X_i$ is the same kind of reactance as $X_{m(i,j)}$ among the reactance serially inserted from the i-th unit into $X_{m(i,j)}$ the $X_i$ being a value including $X_{m(i,j)}$. This holds true for the $X_j$. Assuming that the number of units is two for example, equation (3) can be rewritten as follows:

$$k = \frac{X_m}{\sqrt{X_1 X_2}} \qquad (4)$$

Figure 6:
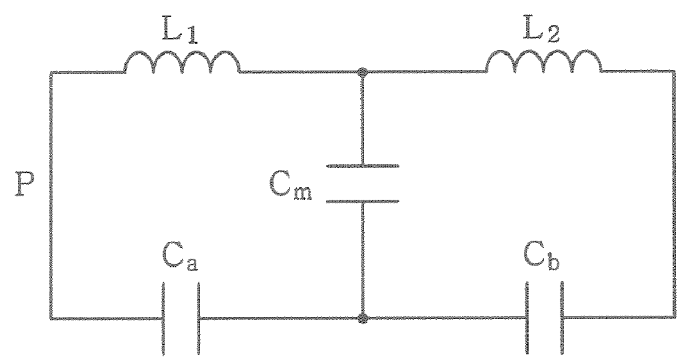
FIG. 6 is a view showing an equivalent resonance circuit in case of the microwave transmitting board having two units.

In general the reactance is capacitance coupling, the state of which can be represented by an equivalent resonance circuit composed of inductors having inductance $L_1$, $L_2$ and capacitors having capacitance $C_a$, $C_b$, $C_m$, as shown in FIG. 6.

In this case, the coupling coefficient k is given by equation (5):

$$k = \sqrt{\frac{C_a C_b}{(C_a + C_m)(C_b + C_m)}} \qquad (5)$$

In this regard, the frequency at which the impedance seen from point P of FIG. 6 becomes zero, i.e., the resonance frequency f of the microwave transmitting board 28 as a whole and the frequency $f_i'(f_1', f_2')$ of the respective units is given by equation (6):

$$f^2 = \frac{f_1'^2 + f_2'^2 \pm \sqrt{(f_1'^2 - f_2'^2)^2 + 4f_1'^2 f_2'^2 k^2}}{2(1 - k^2)} \qquad (6)$$

If the capacitance of the respective units is $C_i$, the frequency $f_i'$ thereof is represented by equation (7):

$$f_i' = \frac{1}{2\pi \sqrt{L_i C_i}} \quad (i = 1, 2) \qquad (7)$$

It can be seen from equations (6) and (7) that there exist two resonance frequencies according to the coupling coefficient k. Particularly, in case the coupling coefficient k is sufficiently smaller than 1, i.e., nearly zero a relationship of $f=f_1'=f_2'$ is established to thereby generate a resonance frequency common to the respective units. Since the coupling coefficient k is nearly zero at this time there exists substantially no interference between the respective units which makes it possible to perform a mode control for the respective units in an interference-free and independent manner.

Accordingly, if the plurality of holes 42 are formed to assure substantially no existence of the coupling coefficient k between the respective units and if the volumes of the holes 42 are adjusted on a unit-by-unit basis by displacing the volume adjustment plugs 43 with the actuators 45, it becomes possible to independently control the impedance of the respective units so that resonance conditions of each of the units can be satisfied. This makes it possible to uniformly control the electric field distribution of the microwave transmitting board 28. Since the distribution and stability of plasma depends on the electric field distribution of the microwave transmitting board, the uniformity and stability of plasma can be increased by uniformly controlling the electric field distribution of the microwave transmitting board 28 in this way. This makes it possible to readily cope with a change in process condition.

Figure 7:
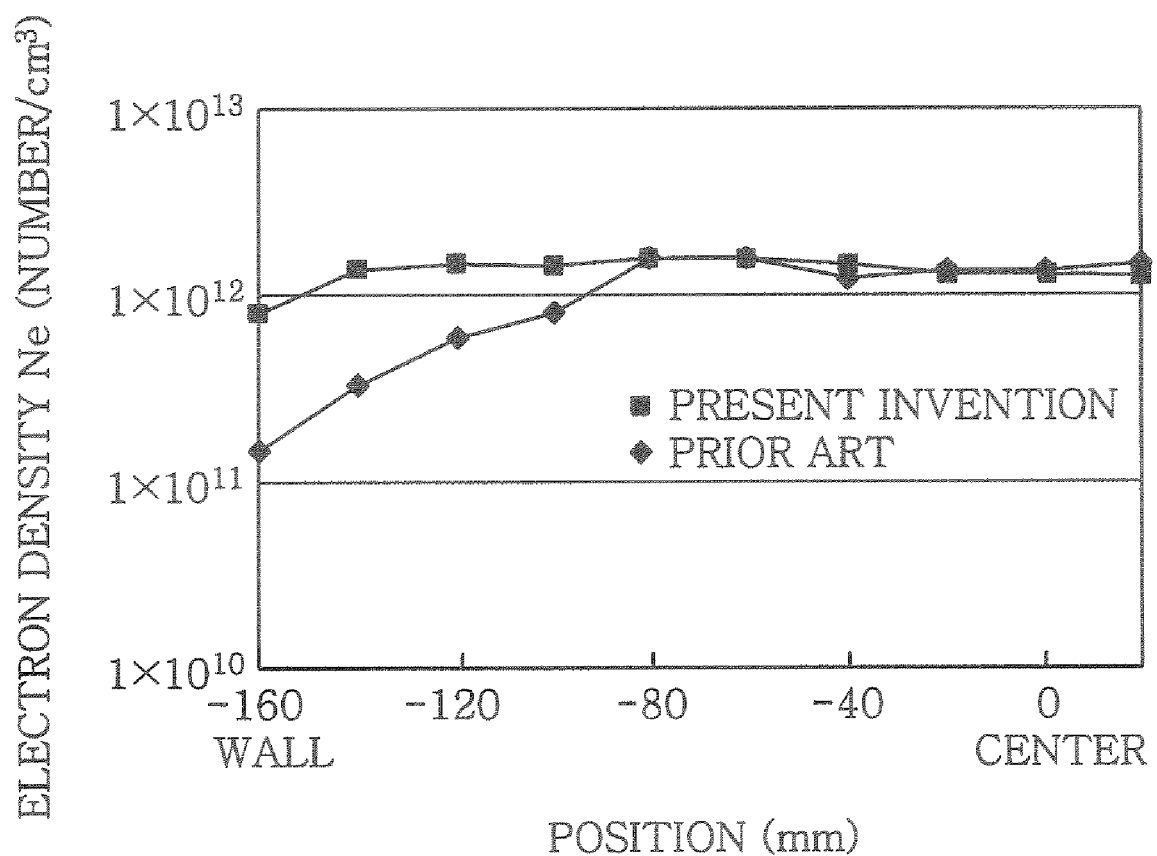
FIG. 7 is a graph comparatively representing the uniformity of electric field distribution of plasma in the present apparatus and the prior art apparatus.

FIG. 7 shows electron density distributions of plasma in an instance where the impedance of the microwave transmitting board 28is controlled with the present apparatus and in an instance where the impedance is fixed by use of the prior art apparatus. As shown in this figure, it has been confirmed that the electron density distribution becomes uniform when the impedance control is performed in accordance with the present embodiment.

Figure 5:
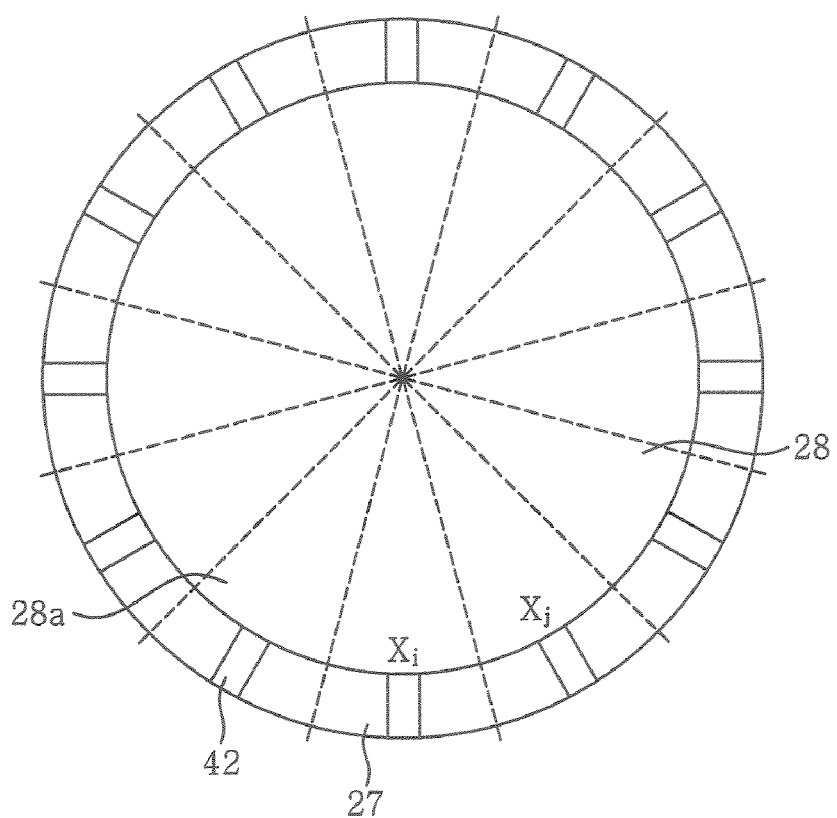
FIG. 5 is a model diagram for explaining electric field distribution of a microwave transmitting board in accordance with the present invention.
Figure 8:
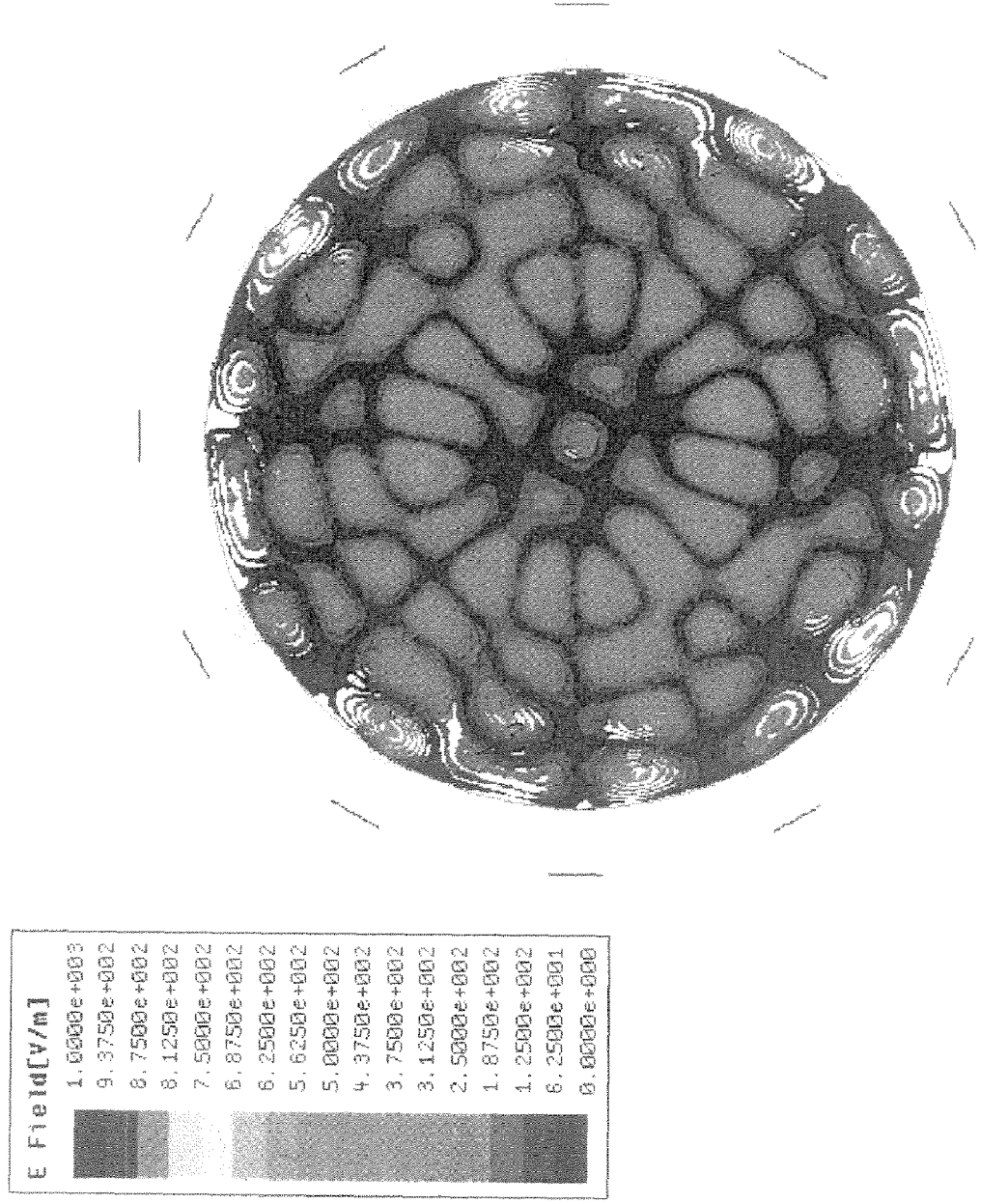
FIG. 8 is a view illustrating the result of simulation of microwave electric field intensity on a surface of the microwave transmitting board in the microwave plasma processing apparatus of the present invention.
Figure 9:
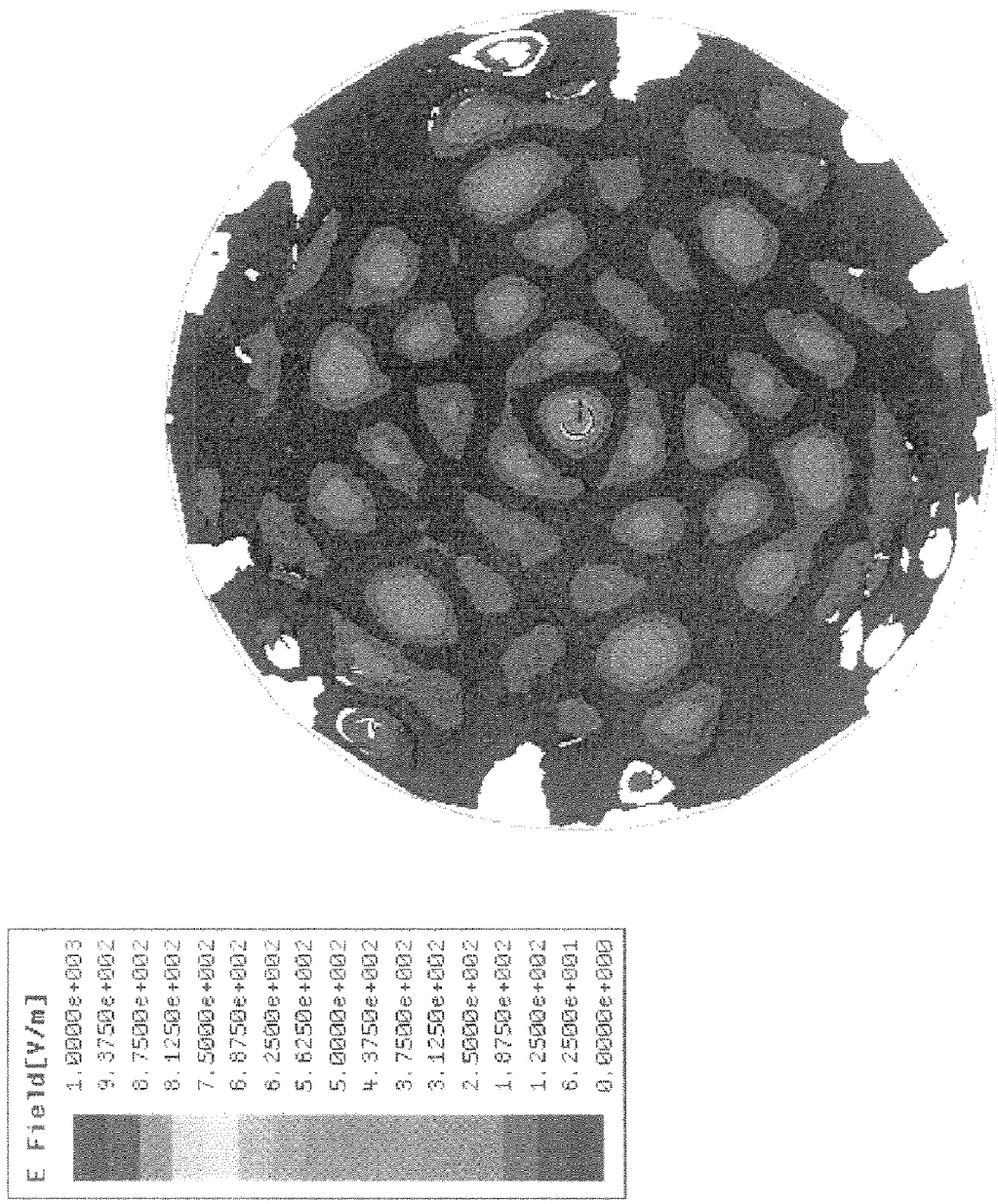
FIG. 9 is a view illustrating the result of simulation of microwave electric field intensity on a surface of the microwave transmitting board in the prior art microwave plasma processing apparatus.

Next, an electromagnetic field simulation for the microwave transmitting board was carried out in respect of the case that twelve holes of 32.3 mm$\phi$ in diameter and 60 mm in length are evenly formed in the top plate as shown in FIG. 5. The results of simulation are shown in FIGS. 8 and 9. As shown in FIG. 8, it has been confirmed that, thanks to adjustment of the volumes of the respective holes, the electric field distribution of the microwave transmitting board becomes more uniform in the present apparatus than in the prior art apparatus, as shown in FIG. 9.

Figure 10:
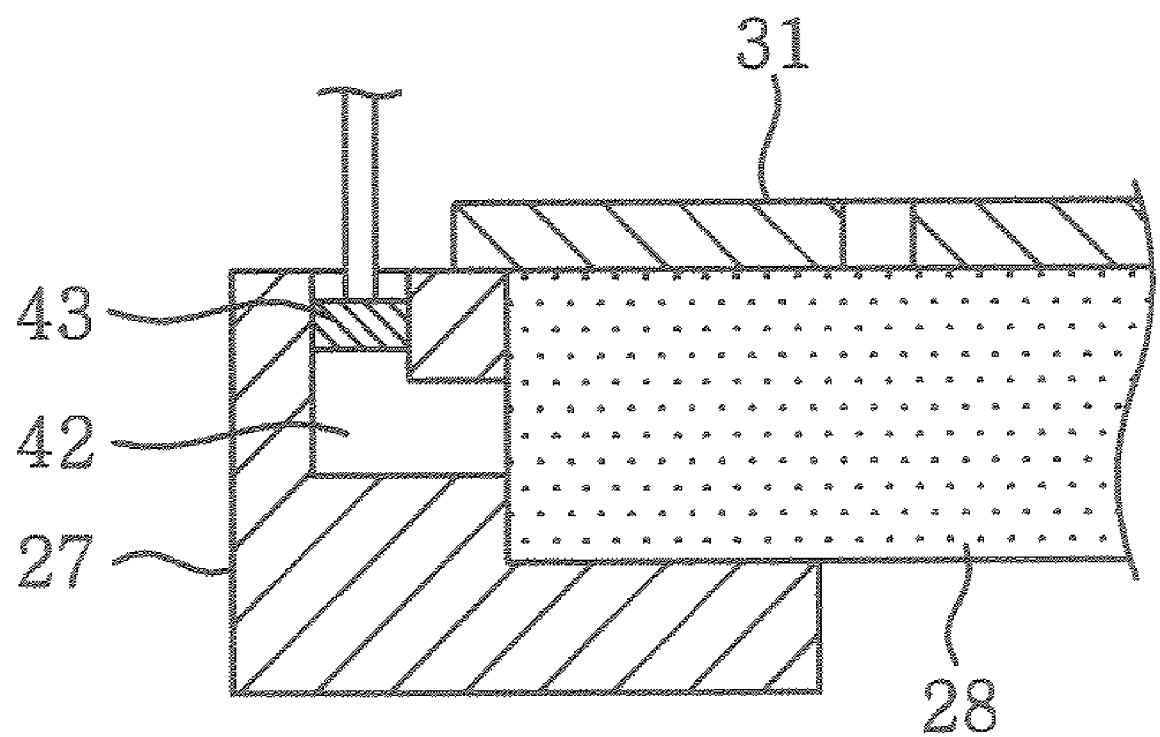
FIG. 10 is a view showing another example of the holes formed in the top plate.

The present invention is not limited to the foregoing embodiment but may be modified in many different forms. As an example, the configuration of the plasma processing apparatus is not restricted to the afore-mentioned embodiment as far as it can comply with the prerequisites of the present invention. Furthermore, although the above description is directed to an exemplary case that the holes formed in the top plate extend outwardly from the end portion of the microwave transmitting board in a horizontal direction and remains opened in the peripheral end portion of the top plate, the present invention is not limited thereto but may employ holes opened on the top surface of the top plate and bent at a right angle within the top plate as shown in FIG. 10. Moreover, the object to be subject to the plasma processing is not limited to the semiconductor wafer but may include other articles such as a flat panel display substrate and the like.

INDUSTRIAL APPLICABILITY

The present invention is useful in plasma processes requiring plasma of low electron temperature and high density, such as an oxidation process, a coating process and an etching process in a semiconductor device manufacturing process. Particularly, the present invention is suitable for use in the etching process in which the uniformity of plasma density does matter.

What is claimed is:

1. A microwave plasma processing apparatus, comprising:
   a chamber for receiving a processing target;
   a microwave generator for generating microwaves;
   a waveguide unit for guiding the microwaves generated in the microwave generator toward the chamber;
   a planar antenna made of a conductive material and having a plurality of microwave radiation openings through which the microwaves guided by the waveguide unit are irradiated toward the chamber;
   a microwave transmitting board made of a dielectric material and forming a top wall of the chamber, the microwave transmitting board adapted to transmit the microwaves passed through the microwave radiation openings of the planar antenna;
   a plate made of a conductive material and covering an outer periphery of the microwave transmitting board;
   two or more holes provided in the plate, wherein the microwaves are propagated into the holes from the microwave transmitting board, the holes being provided to extend from an end portion of the microwave transmitting board into the plate;
   a volume adjustment mechanism for adjusting volumes of the two or more holes;
   a processing gas supply unit for supplying a processing gas into the chamber, wherein plasma of the processing gas is formed within the chamber by the microwaves to perform a plasma processing of the processing target, and wherein, when the microwave transmitting board is divided into individual units to which each of the two or more holes belongs, impedance of the individual units is adjusted to thereby control an electric field distribution of the microwave transmitting board by adjusting the volumes of the holes with the volume adjustment mechanism.

2. The microwave plasma processing apparatus of claim 1, wherein the volume adjustment mechanism includes:
volume adjustment plugs each of which is provided in close contact with one of the holes for movement within said one hole; and
actuators for moving the volume adjustment plugs.

3. The microwave plasma processing apparatus of claim 1, further comprising a controller for controlling the impedance of the individual units by controlling the volume adjustment mechanism.

4. The microwave plasma processing apparatus of claim 1, wherein the waveguide unit includes a rectangular waveguide for propagating the microwaves generated by the microwave generator in a TE mode, a mode converter for converting the TE mode to a TEM mode, and a coaxial waveguide for propagating the microwaves converted to the TEM mode toward the planar antenna.

5. The microwave plasma processing apparatus of claim 1, wherein the plurality of microwave radiation openings are of an elongated slot shape and are arranged to have adjoining microwave radiation openings intersect with each other, the microwave radiation openings being arranged along concentric circles.

6. The microwave plasma processing apparatus of claim 1, further comprising a cover member for covering the planar antenna.

7. The microwave plasma processing apparatus of claim 6, wherein the cover member has a coolant path through which coolant is circulated to cool the planar antenna and the microwave transmitting board.

8. The microwave plasma processing apparatus of claim 1, wherein the volume adjustment mechanism includes volume adjustment plugs each of which is provided in one of the holes and configured to move in a longitudinal direction of said one hole.

9. The microwave plasma processing apparatus of claim 8, wherein the volume adjustment plugs reflect back the microwaves propagating into the holes.

10. A microwave plasma processing apparatus, comprising:
a chamber for receiving a processing target;
a microwave generator for generating microwaves;
a waveguide unit for guiding the microwaves generated in the microwave generator toward the chamber;
a planar antenna made of a conductive material and having a plurality of microwave radiation openings through which the microwaves guided by the waveguide unit are irradiated toward the chamber;
a microwave transmitting board made of a dielectric material and forming a top wall of the chamber, the microwave transmitting board adapted to transmit the microwaves passed through the microwave radiation openings of the planar antenna;
a plate made of a conductive material and covering an outer periphery of the microwave transmitting board;
two or more holes provided in the plate, wherein the microwaves are propagated into the holes from the microwave transmitting board, the holes being provided to extend from an end portion of the microwave transmitting board into the plate;
a volume adjustment mechanism for adjusting volumes of the two or more holes; and
a processing gas supply unit for supplying a processing gas into the chamber,
wherein plasma of the processing gas is formed within the chamber by the microwaves to perform a plasma processing of the processing target, and
wherein, when the microwave transmitting board is divided into individual units to which each of the two or more holes belongs, impedance of the individual units is adjusted to have the individual units satisfy resonance by adjusting the volumes of the holes with the volume adjustment mechanism.

11. The microwave plasma processing apparatus of claim 10, wherein the microwave transmitting board as a whole is adapted to satisfy the resonance conditions.

12. The microwave plasma processing apparatus of claim 11, wherein the volume adjustment mechanism includes volume adjustment plugs each of which is provided in one of the holes and configured to move in a longitudinal direction of said one hole.

13. The microwave plasma processing apparatus of claim 10, wherein the volume adjustment mechanism includes volume adjustment plugs each of which is provided in one of the holes and configured to move in a longitudinal direction of said one hole.

14. The microwave plasma processing apparatus of claim 10, wherein the volume adjustment mechanism includes:
volume adjustment plugs each of which is provided in close contact with one of the holes for movement within said one hole; and
actuators for moving the volume adjustment plugs.

15. The microwave plasma processing apparatus of claim 10, further comprising a controller for controlling the impedance of the individual units by controlling the volume adjustment mechanism.

16. The microwave plasma processing apparatus of claim 10, wherein the waveguide unit includes a rectangular waveguide for propagating the microwaves generated by the microwave generator in a TE mode, a mode converter for converting the TE mode to a TEM mode, and a coaxial waveguide for propagating the microwaves converted to the TEM mode toward the planar antenna.

17. The microwave plasma processing apparatus of claim 10, wherein the plurality of microwave radiation openings are of an elongated slot shape and are arranged to have adjoining microwave radiation openings intersect with each other, the microwave radiation openings being arranged along concentric circles.

18. The microwave plasma processing apparatus of claim 10, further comprising a cover member for covering the planar antenna.

* * * * *